(12) United States Patent
Liu

(10) Patent No.: US 11,139,452 B2
(45) Date of Patent: Oct. 5, 2021

(54) OLED DEVICE, MANUFACTURING METHOD THEREOF AND DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventor: Chengjun Liu, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 26 days.

(21) Appl. No.: 16/621,044

(22) PCT Filed: Mar. 20, 2019

(86) PCT No.: PCT/CN2019/078855
§ 371 (c)(1),
(2) Date: Dec. 10, 2019

(87) PCT Pub. No.: WO2019/201048
PCT Pub. Date: Oct. 24, 2019

(65) Prior Publication Data
US 2020/0176713 A1    Jun. 4, 2020

(30) Foreign Application Priority Data

Apr. 17, 2018 (CN) .......................... 201810343964.4

(51) Int. Cl.
*H01L 51/52* (2006.01)
*H01L 51/00* (2006.01)
(Continued)

(52) U.S. Cl.
CPC ...... *H01L 51/5253* (2013.01); *H01L 51/0034* (2013.01); *H01L 51/529* (2013.01);
(Continued)

(58) Field of Classification Search
CPC ............. H01L 51/5253; H01L 51/0034; H01L 51/5259; H01L 51/529
See application file for complete search history.

(56) References Cited

U.S. PATENT DOCUMENTS

| 9,000,443 B2 | 4/2015 | Hatano |
| 9,537,115 B2 | 1/2017 | Yu |

(Continued)

FOREIGN PATENT DOCUMENTS

| CN | 102057750 A | 5/2011 |
| CN | 102169964 A | 8/2011 |

(Continued)

OTHER PUBLICATIONS

Office Action dated Apr. 12, 2019 issued in corresponding Chinese Application No. 201810343964.4.

*Primary Examiner* — Thomas L Dickey
(74) *Attorney, Agent, or Firm* — Nath, Goldberg & Meyer; Joshua B. Goldberg

(57) ABSTRACT

The present disclosure provides an OLED device, including a substrate, a light-emitting unit arranged on the substrate, and an encapsulation structure arranged on a surface of the light-emitting unit distal to the substrate, the encapsulation structure includes a deoxygenation layer made of an active metal, used to react with oxygen, the active metal is a metal with an activity of reacting with oxygen being between those of aluminum and copper.

17 Claims, 3 Drawing Sheets

(51) Int. Cl.
    *H01L 51/56*         (2006.01)
    *B82Y 30/00*         (2011.01)
(52) U.S. Cl.
    CPC .......... *H01L 51/5259* (2013.01); *H01L 51/56* (2013.01); *B82Y 30/00* (2013.01)

(56) References Cited

U.S. PATENT DOCUMENTS

| | | |
|---|---|---|
| 9,799,854 B2 | 10/2017 | Ramadas et al. |
| 10,658,613 B2 | 5/2020 | Yu et al. |
| 2019/0207154 A1* | 7/2019 | Yu ....................... H01L 51/5246 |

FOREIGN PATENT DOCUMENTS

| | | |
|---|---|---|
| CN | 104269497 A | 1/2015 |
| CN | 204144262 U | 2/2015 |
| CN | 104846376 A | 8/2015 |
| CN | 107316950 A | 11/2017 |
| CN | 108470848 A | 8/2018 |

* cited by examiner

OLED DEVICE, MANUFACTURING METHOD THEREOF AND DISPLAY DEVICE

CROSS-REFERENCE TO RELATED APPLICATION

The present application is a U.S. National Stage Application under 35 U.S.C. § 371 of International Patent Application No. PCT/CN2019/078855, filed on Mar. 20, 2019, which claims the priority of Chinese Patent Application No. 201810343964.4, filed on Apr. 17, 2018, entitled "OLED Device, Manufacturing Method thereof, and Display Device", the disclosure of both of which is hereby incorporated by reference in its entirety into this application.

TECHNICAL FIELD

The present disclosure relates to the field of display technology, and particularly to an OLED device, a manufacturing method thereof, and a display device.

BACKGROUND

An Organic Light-Emitting Diode (OLED) device is featured with self-luminescence function, simple and ultra-thin structure, high response speed, wide viewing angle, low power consumption and realizable flexible display, etc. The OLED device generally includes a substrate and a light-emitting unit disposed on the substrate, which generally includes a cathode, an anode, and a light-emitting layer disposed between the cathode and the anode.

The organic light-emitting material, which the light-emitting layer is made of, is very sensitive to water vapor and oxygen, which can greatly reduce the service life of the OLED device. A cover plate is generally added to the device as an encapsulation structure in the prior art, and the cover plate is combined with the substrate through a sealant, such as epoxy resin, etc. Such an encapsulation structure is equivalent to a cover added to the light-emitting layer, which separates the OLED device from air. However, this way of physical isolation is still inescapable of a small amount of water vapor and oxygen permeation into the light-emitting layer. In addition, when the light from the light-emitting layer directly penetrates through each layer and goes out, due to the differences in refractive index between functional layers, some light will be totally reflected, and the energy of light subjected to the total reflection will be converted into thermal energy to damage the OLED device.

SUMMARY

An OLED device is provided to include a substrate and a light-emitting unit arranged on the substrate, the OLED device further includes an encapsulation structure arranged on a surface of the light-emitting unit away from the substrate, the encapsulation structure includes a deoxygenation layer made of an active metal, used to react with oxygen, the active metal is a metal with an activity of reacting with oxygen being between those of aluminum and copper.

Optionally, the encapsulation structure further includes a heat dissipation layer arranged on a surface of the deoxygenation layer near or away from the light-emitting unit.

Optionally, the encapsulation structure further includes a hydrophobic layer arranged on a surface of the deoxygenation layer near or away from the light-emitting unit.

Optionally, the heat dissipation layer, the deoxygenation layer and the hydrophobic layer are successively arranged on the substrate.

Optionally, the deoxygenation layer is a nanoarray layer made of the active metal.

Optionally, the hydrophobic layer is attached to a surface of the nanoarray layer.

Optionally, the active metal includes copper, iron or aluminum.

Optionally, the heat dissipation layer is made of polyimide.

Optionally, the hydrophobic layer is made of heptadecafluoro-1,1,2,2-tetradecyl.

Optionally, the light-emitting device further includes an inner encapsulation layer and an outer encapsulation layer, and the encapsulation structure is arranged between the inner encapsulation layer and the outer encapsulation layer.

The present disclosure further provides a manufacturing method of an OLED device, including the following manufacturing steps:

forming a light-emitting unit on a substrate;

forming an encapsulation structure on the light-emitting unit, and the formation of the encapsulation structure includes a step for forming a deoxygenation layer including an active metal for reacting with oxygen, the active metal is a metal with an activity of reacting with oxygen being between those of aluminum and copper.

Optionally, the formation of the encapsulation structure further includes a step for forming a heat dissipation layer on a surface of the deoxygenation layer near or away from the light-emitting unit, the heat dissipation layer is a polyimide film, and the step for forming a heat dissipation layer includes: adding N,N-dimethyl acetamide (DMAc) into polyamide acid (PAA) with a mass fraction of about 24% to form a solution, wherein a mass ratio of DMAc to PAA is 2.0:1-2.1:1, and forming a film on an inner encapsulation layer with the solution followed by drying to obtain a polyimide film.

Optionally, the step for forming a deoxygenation layer includes: a step for forming a nanoarray layer of the active metal by vacuum magnetron sputtering.

Optionally, a step for forming a hydrophobic layer is further included after the step for forming a deoxygenation layer, and the step for forming a hydrophobic layer includes:

forming a solution containing heptadecafluoro-1,1,2,2-tetradecyl on a surface of the deoxygenation layer away from the substrate or near the light-emitting unit, followed by drying to remove solvent; wherein a mass fraction of heptadecafluoro-1,1,2,2-tetradecyl in the solution containing heptadecafluoro-1,1,2,2-tetradecyl is about 0.1-10%.

Optionally, an outer encapsulation layer is formed on the encapsulation structure.

The invention also provides a display device, including the above OLED device.

DETAILED DESCRIPTION

To enable those skilled in the art to better understand the present disclosure, the following detailed description for the present disclosure is further made based on the attached drawings and specific embodiments.

Figure 1:
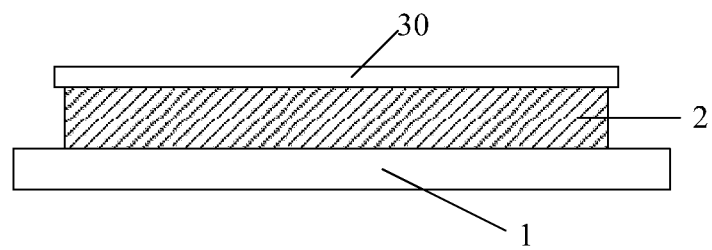
FIG. 1 is a schematic diagram of a structure of an OLED device according to an embodiment of the present disclosure.
Figure 2:
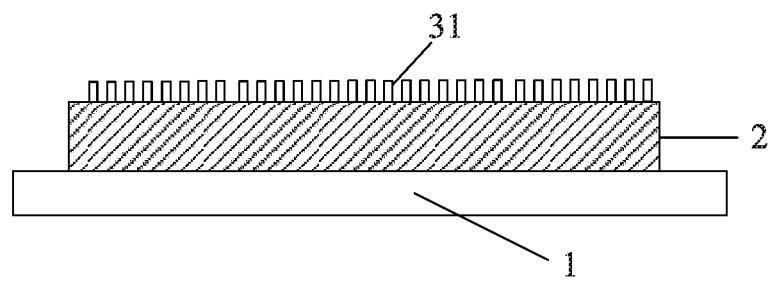
FIG. 2 is a schematic diagram of a structure of an OLED device according to an embodiment of the present disclosure.

An embodiment of the disclosure provides an OLED device, as shown in FIG. 1, including a substrate 1 and a light-emitting unit 2 arranged on the substrate 1, the OLED device further includes an encapsulation structure arranged at a side of the light-emitting unit 2 distal to the substrate 1, and the encapsulation structure includes a deoxygenation layer 30 consisting of an active metal, used to react with oxygen.

In the encapsulation structure of the OLED device according to the present embodiment, an active metal is adopted to form the deoxygenation layer 30 to remove oxygen from the environment where the OLED device is used. When the device is penetrated with a small amount of oxygen, a chemical reaction will be occur between a part of the active metal in the deoxygenation layer 30 and oxygen to generate metal oxide with stable properties to further isolate from water and oxygen. This is equivalent to the fact that the deoxygenation layer 30 absorbs a small amount of oxygen to achieve a barrier of oxygen in a way of chemical absorption to remove oxygen. The OLED device is suitable for various display devices.

The active metal in this embodiment means a metal which is liable to react with oxygen. The order of activities of common metals is, from strong to weak: potassium, calcium, barium, sodium, magnesium, aluminum, manganese, zinc, chromium, iron, cobalt, nickel, tin, lead, antimony, beryllium, copper, mercury, silver, platinum, gold (K, Ca, Ba, Na, Mg, Al, Mn, Zn, Cr, Fe, Co, Ni, Sn, Pb, Sb, Be, Cu, Hg, Ag, Pt, Au). In this application, metals with activities of reacting with oxygen being between those of aluminum and copper are used, such as active metals commonly used: copper, iron, aluminum, etc.

An embodiment of the disclosure provides an OLED device, as shown in FIGS. 2-5, including a substrate 1 and a light-emitting unit 2 arranged on the substrate 1, the OLED device further includes an encapsulation structure 3 arranged at a side of the light-emitting unit 2 distal to the substrate 1, the encapsulation structure 3 includes a nanoarray layer 31 made of an active metal, used to react with oxygen.

The light-emitting unit 2 in this embodiment usually includes an anode, a cathode and a light-emitting layer sandwiched between the anode and the cathode. According to different luminescence requirements, the light-emitting unit 2 can also be added with other corresponding functional layers, such as a hole injection layer, a hole transport layer, an electron injection layer and an electron transport layer.

The active metal in this embodiment is disposed in the form of a nanoarray. That is to say, the deoxygenation layer 30 is a layer formed by multiple nanorods of active metal. The benefit of such a nanoarray design is increasing the surface area of the active metal in contact with oxygen, the outer surface of each nanorod, namely the lateral surface and the upper surface, can both react with oxygen to achieve the effect of oxygen isolation. Herein, "oxygen" contains oxygen molecules, oxygen atoms, and oxygen gas. That is to say, an active metal can react with any form of oxygen that exists, and consume it.

The thickness of the deoxygenation layer 30 is not limited herein, which means that the height of the nanorod can be adjusted according to the requirements of the actual product. For example, the height of the nanorod can be in the range of 20 nm to 200 nm.

The active metal in this embodiment means a metal which is liable to react with oxygen. The order of activities of common metals is, from strong to weak: potassium, calcium, barium, sodium, magnesium, aluminum, manganese, zinc, chromium, iron, cobalt, nickel, tin, lead, antimony, beryllium, copper, mercury, silver, platinum, gold (K, Ca, Ba, Na, Mg, Al, Mn, Zn, Cr, Fe, Co, Ni, Sn, Pb, Sb, Be, Cu, Hg, Ag, Pt, Au). In this application, metals with activities of reacting with oxygen being between those of aluminum and copper are used, such as active metals commonly used: copper, iron, aluminum, etc.

As an optional embodiment, the active metal includes aluminum, that is, an aluminum nanoarray layer 31 may be used herein as the deoxygenation layer 30. The aluminum metal used in the device is relatively safe and will not have adverse effects on other functional layers; and aluminum oxide formed by the reaction between aluminum and oxygen is also very stable, which can further isolate water and oxygen. In addition, the cost of using aluminum is lower.

In one embodiment, the encapsulation structure 3 also includes a heat dissipation layer 32 disposed further away from substrate 1 compared with the light-emitting unit 2.

There is no limit on the thickness of the heat dissipation layer 32. For example, the thickness of the heat dissipation layer 32 may be in a range from 10 μm to 50 μm. The relative position relation between the heat dissipation layer 32 and the deoxygenation layer 30 is not limited herein, either. In other words, the deoxygenation layer 30 may be closer to the light-emitting unit 2 than the heat dissipation layer 32, or the heat dissipation layer 32 may be closer to the light-emitting unit 2 than the deoxygenation layer 30. When the heat dissipation layer 32 is closer to the light-emitting unit 2, it is more convenient for emission of internal heat from the light-emitting unit 2.

In an embodiment, the heat dissipation layer 32 is made of polyimide. Polyimide has excellent heat dissipation performance, and can improve the heat dissipation of the OLED device.

In an embodiment, the encapsulation structure 3 further includes a hydrophobic layer 33 disposed farther away from the substrate 1 compared with the light-emitting unit 2.

The thickness of the hydrophobic layer 33 is not limited herein. For example, the thickness of the hydrophobic layer 33 may be in a range of 50 nm to 150 nm. Meanwhile, the relative position relation between the hydrophobic layer 33 and the deoxygenation layer 30 is not limited, either. In other words, the deoxygenation layer 30 may be closer to the light-emitting unit 2 than the hydrophobic layer 33, or the hydrophobic layer 33 may be closer to the light-emitting unit 2 than the deoxygenation layer 30.

In an embodiment, the hydrophobic layer 33 is made of heptadecafluoro-1,1,2,2-tetradecyl.

The surface energy of heptadecafluoro-1,1,2,2-tetradecyl is low, and the hydrophobic layer 33 made of heptadecafluoro-1,1,2,2-tetradecyl has a super hydrophobic surface. Further, the metal of the deoxygenation layer 30 has a high surface energy and is hydrophilic, Al metal, for example, will be further explained. Al is covered on its surface by hydroxyls when encountering water, while a group containing silane in heptadecafluoro-1,1,2,2-tetradecyl converts into a silanol group (Si—OH) when encountering water, silanol groups (Si—OH) reacts with hydroxyls on the surface of the Al metal in dehydration and condensation reactions, resulting in a monomolecular membrane combined by covalent bonds. The contact angle of this monomolecular membrane with water is up to more than 160°, and the rolling angle is less than 1°, which is equivalent to the fact that the monomolecular membrane in which Si in heptadecafluoro-1,1,2,2-tetradecyl and Al are further bonded to each other has a function of second barrier for waterproofing.

Figure 3:
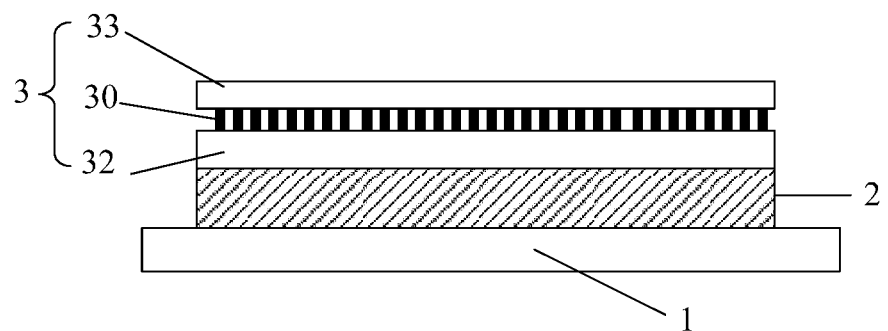
FIG. 3 is a schematic diagram of a structure of an OLED device according to an embodiment of the present disclosure.

In another embodiment, as shown in FIG. 3, the heat dissipating layer 32, the deoxygenation layer 30, and the hydrophobic layer 33 are arranged successively in the direction away from the substrate 1.

Figure 4:
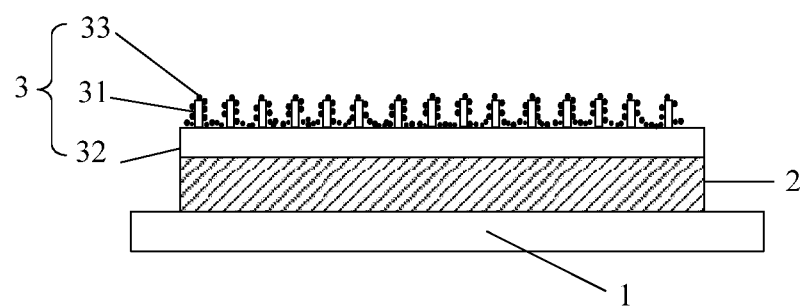
FIG. 4 is a schematic diagram of a structure of an OLED device according to an embodiment of the present disclosure.

Among them, the heat dissipation layer 32 which is closest to the light-emitting unit 2 of the three layers can fully dissipate the internal heat outwards. It should be noted that, as shown in FIG. 4, the hydrophobic layer 33 may be hydrophobic nanoparticles or hydrophobic molecular chains attached to the surface of the nanoarray layer 31 or the heat dissipation layer 32.

Figure 5:
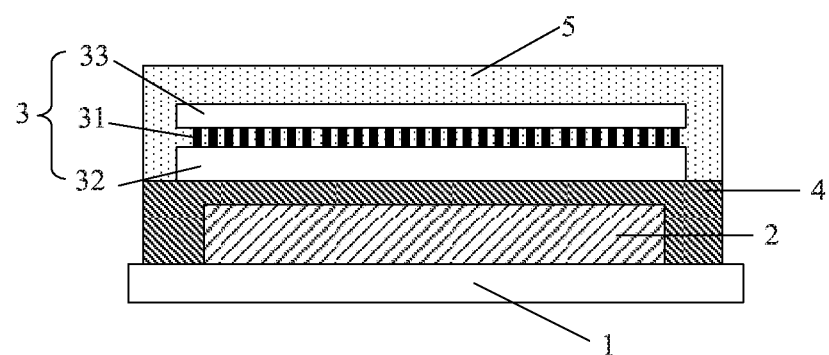
FIG. 5 is a schematic diagram of a structure of an OLED device according to an embodiment of the present disclosure.

In an embodiment, as shown in FIG. 5, the light-emitting device further includes an inner encapsulation layer 4 and an outer encapsulation layer 5, and the encapsulation structure 3 is located between the inner encapsulation layer 4 and the outer encapsulation layer 5.

That is to say, after the inner encapsulation layer 4 is arranged on a side of light-emitting unit 2 distal to the substrate 1, the encapsulation structure 3 of the above three layers is formed on the inner encapsulation layer 4, and then the outer encapsulation layer 5 is arranged on the encapsulation structure 3. The encapsulation structure 3 is arranged between the inner encapsulation layer 4 and the outer encapsulation layer 5. The inner encapsulation layer 4 and the outer encapsulation layer 5 physically insulate water and oxygen. Poly-paraxylene films may be used for both the inner encapsulation layer 4 and the outer encapsulation layer 5, and the inner encapsulation layer 4 or the outer encapsulation layer 5 may be a multilayered structure including organic and inorganic films which are alternately formed.

It should be understood that, the sizes and the thicknesses of the above structural layers shown in the attached drawings of this example are only illustrative. In the process for forming the structural layers, the projection areas of the structural layers on the substrate may be the same or different, which may be adjusted according to the needs of different products.

Figure 6:
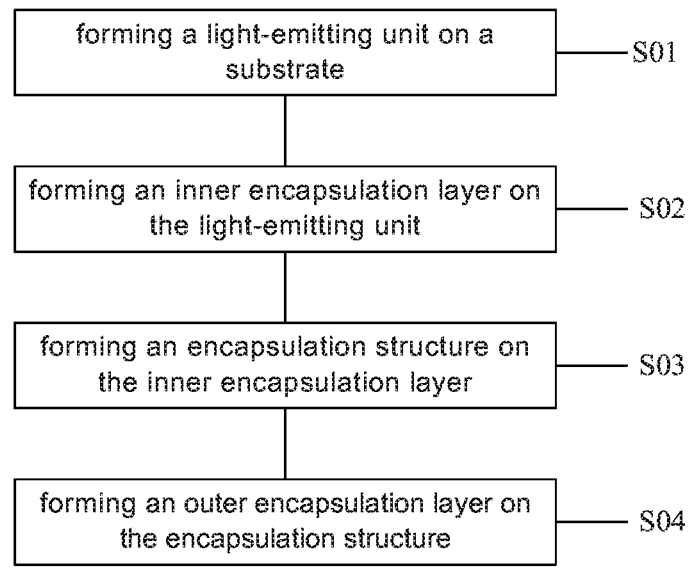
FIG. 6 is a flow chart illustrating a manufacturing method of an OLED device according to an embodiment of the present disclosure.

An embodiment of the disclosure provides a manufacturing method of an OLED device, as shown in FIG. 6, including the following steps.

In a step S01, a light-emitting unit is formed on a washed substrate; it should be understood that, the substrate may be a glass substrate or a flexible substrate; the process of forming the light-emitting unit is similar to the existing process and will not be described herein.

In an optional step S02, an inner encapsulation layer is formed on the light-emitting unit; specifically, organic and inorganic films may be formed alternately to obtain a multi-layer structure as the inner encapsulation layer.

Figure 7:
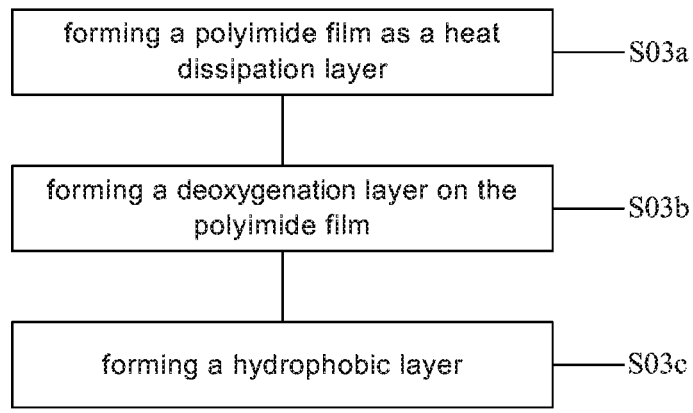
FIG. 7 is a flow chart illustrating a manufacturing method of an encapsulation structure of an OLED device according to an embodiment of the present disclosure.

In a step S03, an encapsulation structure is formed on the inner encapsulation layer, as shown in FIG. 7, which may include the following steps.

In an optional step S03a, a polyimide film is formed as a heat dissipation layer. Specifically, DMAc (N,N-dimethyl acetamide) is first added to PAA (polyamide acid) with a mass fraction of 24%. The mass ratio of DMAc to PAA is 2.0:1-2.1:1. Then, a solution obtained is placed at 4-6° C. for 40-48 h, and a film is formed on the inner encapsulation layer with the solution by a flat scraping method. The film is dried at 45-50° C. for 16-20 h, and kept at 100° C. and 200° C. for 1 h respectively, and then kept at 300° C. for 30 min, to obtain the polyimide film.

In a step S03b, a deoxygenation layer is formed on the polyimide film; the deoxygenation layer includes an active metal for reacting with oxygen. Specifically, a nanoarray layer of the active metal may be formed by vacuum magnetron sputtering. More specifically, Al metal is taken as an example: the purity of an aluminum target is more than 99.99%, and the diameter is 6 cm; the shielding gas during sputtering is high-purity argon, and the vacuum degree is no less than $6*10^{-4}$ Pa. The process conditions of the sputtering are: temperature is 220-250° C., target spacing is 3-4 cm, sputtering power is 60-80 W, deposition time is 2-4 min, and working pressure is 8-12 Pa.

In an optional step S03c, a hydrophobic layer is formed, which means that the polyimide film and the deoxygenation layer are hydrophobically treated. The step for forming the hydrophobic layer may include: forming a solution containing heptadecafluoro-1,1,2,2-tetradecyl on a side of the deoxygenation layer away from the substrate, followed by drying to remove solvent; a mass fraction of heptadecafluoro-1,1,2,2-tetradecyl in the solution containing heptadecafluoro-1,1,2,2-tetradecyl is about 0.1-10%. Specifically, the substrate that is subjected to the above steps may be immersed in ethanol solution of heptadecafluoro-1,1,2,2-tetradecyl (PFAS), treated at 0-40° C. for 1-2 h, and then placed directly in a blast air oven drying at 80-90° C. for 5-8 min to obtain the hydrophobic layer.

In an optional step S04, an outer encapsulation layer is formed on the encapsulation structure. Specifically, the outer encapsulation layer may be prepared by a poly-paraxylene film, or by alternately forming organic and inorganic films to result in a multilayered structure as the outer encapsulation layer.

An embodiment of the disclosure provides a display device including any of the above OLED devices. The display device may be any product or component with a display function such as an electronic paper, an OLED panel, a mobile phone, a tablet computer, a TV set, a monitor, a laptop computer, a digital photo frame, a navigator.

It should be understood that, the above embodiments are only exemplary embodiments used to illustrate the principles of the disclosure, but the disclosure is not limited to them. For those ordinary skilled in the art, various variations and improvements can be made without departing from the spirit and essence of the disclosure, and are also regarded as the protection scope of the present disclosure.

The invention claimed is:

1. An OLED device, comprising a substrate and a light-emitting unit on the substrate, wherein
the OLED device further comprises an encapsulation structure on a surface of the light-emitting unit distal to the substrate, the encapsulation structure comprises a deoxygenation layer made of an active metal, used to react with oxygen, and the active metal is a metal with an activity of reacting with oxygen being between those of aluminum and copper, the deoxygenation layer is a nanoarray layer made of the active metal.

2. The OLED device according to claim 1, wherein the encapsulation structure further comprises a heat dissipation layer on a surface of the deoxygenation layer proximal to or distal to the light-emitting unit.

3. The OLED device according to claim 2, wherein the encapsulation structure further comprises a hydrophobic layer on a surface of the deoxygenation layer proximal to or distal to the light-emitting unit.

4. The OLED device according to claim 3, wherein the heat dissipation layer, the deoxygenation layer and the hydrophobic layer are successively arranged on the substrate.

5. The OLED device according to claim 1, wherein the hydrophobic layer is attached to a surface of the nanoarray layer.

6. The OLED device according to claim 5, wherein the active metal comprises copper, iron or aluminum.

7. The OLED device according to claim 6, wherein the heat dissipation layer is made of polyimide; and the hydrophobic layer is made of heptadecafluoro-1,1,2,2-tetradecyl.

8. The OLED device according to claim 7, wherein the light-emitting device further comprises an inner encapsulation layer and an outer encapsulation layer, and the encapsulation structure is arranged between the inner encapsulation layer and the outer encapsulation layer.

9. A display device, including an OLED device according to claim 1.

10. The OLED device according to claim 1, wherein the nanoarray layer comprise a plurality of nanorods of the active metal.

11. The OLED device according to claim 10, wherein the height of the nanorod is in a range of 20 nm to 200 nm.

12. A manufacturing method of an OLED device, comprising steps:

forming a light-emitting unit on a substrate;
forming an encapsulation structure on the light-emitting unit, which comprises a step of forming a deoxygenation layer made of an active metal for reacting with oxygen, wherein the active metal is a metal with an activity of reacting with oxygen being between those of aluminum and copper, wherein the step of forming a deoxygenation layer includes: forming a nanoarray layer of the active metal.

13. The manufacturing method according to claim 12, wherein the forming an encapsulation structure on the light-emitting unit comprises a step of forming a heat dissipation layer such that the heat dissipation layer is arranged on a surface of the deoxygenation layer proximal to or distal to the light-emitting unit, the heat dissipation layer is a polyimide film, and the forming a heat dissipation layer comprises: adding N,N-dimethyl acetamide (DMAc) into polyamide acid (PAA) with a mass fraction of about 24% to form a solution, wherein a mass ratio of DMAc to PAA is 2.0:1-2.1:1, and forming a film with the solution followed by drying to obtain a polyimide film.

14. The manufacturing method according to claim 13, wherein the forming a nanoarray layer of the active metal includes forming the nanoarray layer of the active metal by vacuum magnetron sputtering.

15. The manufacturing method according to claim 14, wherein the forming an encapsulation structure on the light-emitting unit comprises forming a hydrophobic layer, which comprises:

forming a solution containing heptadecafluoro-1,1,2,2-tetradecyl on a surface of the deoxygenation layer distal to or proximal to the light-emitting unit, followed by drying to remove solvent; wherein a mass fraction of heptadecafluoro-1,1,2,2-tetradecyl in the solution containing heptadecafluoro-1,1,2,2-tetradecyl is about 0.1-10%.

16. The manufacturing method according to claim 15, further comprising forming an outer encapsulation layer on the encapsulation structure.

17. The manufacturing method according to claim 16, before forming the outer encapsulation layer, the manufacturing method further comprises forming an inner encapsulation layer on the light emitting unit.

* * * * *